US012803310B2

(12) United States Patent
Lee

(10) Patent No.: US 12,803,310 B2
(45) Date of Patent: Nov. 17, 2026

(54) BATTERY PROTECTION CIRCUIT HAVING SECONDARY PROTECTION IC FUNCTION, METHOD FOR MEASURING VOLTAGE OF SERIES-CONNECTED CELLS USING SAME, AND BATTERY PROTECTION METHOD

(71) Applicant: LG ENERGY SOLUTION, LTD., Seoul (KR)

(72) Inventor: Jong Kyung Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 767 days.

(21) Appl. No.: 18/030,415

(22) PCT Filed: Feb. 18, 2022

(86) PCT No.: PCT/KR2022/002428
§ 371 (c)(1),
(2) Date: Apr. 5, 2023

(87) PCT Pub. No.: WO2022/177350
PCT Pub. Date: Aug. 25, 2022

(65) Prior Publication Data

US 2023/0402862 A1 Dec. 14, 2023

(30) Foreign Application Priority Data

Feb. 18, 2021 (KR) ........................ 10-2021-0021899

(51) Int. Cl.
*H02J 7/00* (2026.01)
*G01R 31/3835* (2019.01)
(Continued)

(52) U.S. Cl.
CPC ............ *H02J 7/80* (2026.01); *G01R 31/3835* (2019.01); *H01M 10/482* (2013.01); *H02J 7/50* (2026.01); *H02J 7/61* (2026.01); *H02J 7/63* (2026.01)

(58) Field of Classification Search
CPC ........................................................ H02J 7/80
(Continued)

(56) References Cited

U.S. PATENT DOCUMENTS

2009/0295396 A1 12/2009 Kouchi et al.
2010/0237873 A1 9/2010 Franke et al.
(Continued)

FOREIGN PATENT DOCUMENTS

CN 204407869 U 6/2015
EP 2 412 581 A1 2/2012
(Continued)

OTHER PUBLICATIONS

Extended European Search Report for European Application No. 22756548.8, dated Apr. 19, 2024.
(Continued)

*Primary Examiner* — Yalkew Fantu
(74) *Attorney, Agent, or Firm* — Birch, Stewart, Kolasch & Birch, LLP

(57) ABSTRACT

The present invention relates to a battery protection circuit implementing a secondary protection IC function and a voltage measurement method of series-connected cells using the same, and more particularly, to a battery protection circuit that implements a secondary protection IC function that measures the voltage of series-connected cells using a switch and an MCU without a separate secondary protection IC, and a voltage measurement method for series-connected cells using the same.

13 Claims, 3 Drawing Sheets

(51) Int. Cl.

| | |
|---|---|
| ***H01M 10/48*** | (2006.01) |
| ***H02J 7/50*** | (2026.01) |
| ***H02J 7/61*** | (2026.01) |
| ***H02J 7/63*** | (2026.01) |
| ***H02J 7/80*** | (2026.01) |

(58) Field of Classification Search
USPC .......................................................... 320/134
See application file for complete search history.

(56) References Cited

U.S. PATENT DOCUMENTS

| | | | | |
|---|---|---|---|---|
| 2011/0074431 | A1* | 3/2011 | Li | G01R 31/396 324/426 |
| 2011/0121837 | A1 | 5/2011 | Kim et al. | |
| 2013/0163134 | A1 | 6/2013 | Ji | |
| 2017/0057372 | A1* | 3/2017 | Loftus | B60L 53/14 |
| 2017/0187201 | A1 | 6/2017 | Wang et al. | |
| 2017/0210229 | A1* | 7/2017 | Brochhaus | B60L 3/0046 |
| 2020/0153262 | A1* | 5/2020 | Yoon | B60L 58/12 |
| 2021/0043914 | A1 | 2/2021 | Lee | |

FOREIGN PATENT DOCUMENTS

| | | | | |
|---|---|---|---|---|
| JP | 2010-145128 | A | 7/2010 | |
| JP | 5169491 | B2 | 3/2013 | |
| JP | 5627278 | B2 | 11/2014 | |
| KR | 10-1106353 | B1 | 1/2012 | |
| KR | 10-1244493 | B1 | 3/2013 | |
| KR | 10-2013-0075640 | A | 7/2013 | |
| KR | 10-1544935 | B1 | 8/2015 | |
| KR | 10-1826645 | B1 | 2/2018 | |
| KR | 10-2019-0047601 | A | 5/2019 | |
| KR | 10-2019-0094706 | A | 8/2019 | |
| KR | 20190094706 | A * | 8/2019 | H02J 7/007182 |

OTHER PUBLICATIONS

International Search Report (PCT/ISA/210) issued in PCT/KR2022/002428, dated Jun. 7, 2022.

* cited by examiner

BATTERY PROTECTION CIRCUIT HAVING SECONDARY PROTECTION IC FUNCTION, METHOD FOR MEASURING VOLTAGE OF SERIES-CONNECTED CELLS USING SAME, AND BATTERY PROTECTION METHOD

CROSS REFERENCE TO RELATED APPLICATIONS

This application is the National Phase of PCT/KR2022/002428 filed on Feb. 18, 2022, which claims priority under 35 U.S.C. § 119(a) to Korean Patent Application No. 10-2021-0021899 filed in the Republic of Korea on Feb. 18, 2021, all of which are hereby expressly incorporated by reference into the present application.

TECHNICAL FIELD

The present invention relates to a battery protection circuit and a voltage measurement method for series-connected cells using the same, and more particularly, to a battery protection circuit implementing a secondary protection IC function for measuring the voltage of battery cells connected in series without a secondary protection IC, and a measurement method thereof.

BACKGROUND ART

The battery protection circuit 10 applied to the battery pack is configured with an AFE (monitoring IC) 11 that monitors the state of the battery in order to protect the battery from abnormal problems such as overcharging and overdischarging. In addition, a component 12 for secondary protection for secondary monitoring of the voltage state of the battery is separately provided so that the battery can be normally protected from an abnormal problem even when the AFE (monitoring IC) does not operate normally.

As a component for such secondary protection, in general, a separate AFE is additionally used for an automobile battery pack, and a hardware-based secondary protection IC is used for a small electronic device such as a notebook computer.

FIG. 1 is a diagram schematically illustrating a battery protection circuit used in a conventional battery pack for LEV. A battery pack for Light Electric Vehicle (LEV) mounted on a light electric vehicle such as an electric scooter or an electric bicycle uses a secondary protection IC 12 in case of dual application of AFE, such as in automotive battery packs, due to the price problem, in most cases, as shown in FIG. 1.

However, secondary protection ICs are relatively vulnerable to electromagnetic compatibility (EMC), and thus there is an issue of causing various problems in a manufacturing process or an actual use area.

As a related prior art, there are the following patent documents.

(Patent Document 1) KR1244493 B1

DISCLOSURE OF THE INVENTION

Technical Problem

The present invention is to solve the above-mentioned problem, and provides a battery protection circuit for a battery pack for LEV that is cheaper than secondary protection IC and has a secondary protection IC that is strong against electromagnetic compatibility (EMC), and a voltage measurement method for series-connected cells using the same.

Technical Solution

According to the present invention, a battery protection circuit configured in a battery pack in which N (N≥2) battery cells are connected in series with each other, and a negative pole (−) of a first cell at the lowest end among the battery cells is connected to a ground (GND) includes: a plurality of primary sensing lines connected between positive/negative electrodes (+,−) of each battery cell and a monitoring integrated circuit (IC); the monitoring IC configured to perform primary monitoring by measuring a voltage of each of the battery cells through the plurality of primary sensing lines; a plurality of secondary sensing lines connected to each of the primary sensing lines; a switch configured to connect one sensing line among the secondary sensing lines and a micro control unit (MCU); and the MCU configured to measure the ground (GND) and a positive electrode (+) voltage of each battery cell with one of the secondary sensing lines connected through a control of the switch, and perform secondary monitoring by sequentially calculating voltages of the first cell to the N-th cell based on the measured ground (GND) and positive electrode (+) voltages of the battery cells.

In detail, the plurality of primary sensing lines includes: a primary first sensing line having a first end connected to the negative electrode (−) of the first cell and the other end connected to the monitoring IC; a primary N-th sensing line having a first end connected between the positive electrode (+) of the (N−1)-th cell and the negative electrode (−) of the N-th cell connected to an upper end of the (N−1)-th cell and the other end connected to the monitoring IC; and a primary (N+1)-th sensing line having a first end connected to the positive electrode (+) of the N-th cell and the other end connected to the monitoring IC.

Moreover, the plurality of secondary sensing lines include: a secondary first sensing line having a first end connected to the primary first sensing line and a second end connected to the MCU through the switch to sense a ground (GND) voltage; a secondary N-th sensing line having a first end connected to the primary N-th sensing line and a second end connected to the MCU through the switch to sense the positive electrode (+) voltage of the (N−1)-th cell; and a secondary (N+1)-th sensing line having a first end connected to the primary (N+1)-th sensing line and a second end connected to the MCU through the switch to sense the positive electrode (+) voltage of the N-th cell.

Moreover, the MCU includes: a switch control unit configured to sequentially locate the switch alternately from the secondary first sensing line and the secondary second sensing line to the (N+1)-th sensing line; a cell voltage measurement unit configured to measure ground (GND) and positive electrode (+) voltages of a corresponding battery cell with a secondary sensing line connected through a switch under the control of the switch control unit; a cell voltage calculation unit configured to sequentially calculate voltage values from the first cell to the N-th cell using the ground (GND) and positive electrode (+) voltages of the battery cells measured by the cell voltage measurement unit; and a secondary monitoring unit configured to perform secondary monitoring of voltage states of the battery cells based on respective voltage values of the first to N-th cells calculated by the cell voltage calculation unit.

Accordingly, the cell voltage calculation unit calculates the voltage value of the first cell from the positive electrode (+) voltage of the first cell and the ground (GND) measured by the cell voltage measurement unit, calculates the voltage summation values of the first to N-th cells with the positive electrode (+) voltage of the N-th cell and the ground (GND) measured by the cell voltage measurement unit, and calculates the voltage value of the N-th cell by subtracting the voltage summation values of the first to (N−1)-th cells from the calculated voltage summation values of the first to N-th cells.

According to the present invention, a method of measuring a voltage of an N-th cell from a first cell at the lowest end among battery cells by using a switch connecting a micro control unit (MCU) and a voltage sensing line connected to each of N (N≥2) battery cells connected in series includes: a first cell voltage measurement step of sequentially positioning the switch to the voltage sensing line connected to a negative electrode (−) of the first cell connected to the ground (GND) and the positive electrode (+) of the first cell, respectively, to measure the voltage value of the first cell with the ground (GND) and the positive electrode (+) voltage of the first cell through the switch; and an N cell voltage calculation step of sequentially positioning the switch to a voltage sensing line connected to the negative electrode (−) of the first cell connected to the ground (GND) and the positive electrode (+) of the N-th cell connected to the upper end of the first cell, respectively.

Here, the N-th cell voltage calculation step includes: measuring the voltage summation values of the first to N-th cells with the ground (GND) and the positive electrode (+) voltage of the N-th cell, and calculating the voltage value of the N-th cell by subtracting the voltage summation values of the first to (N−1)-th cells from the measured first to N-th cells voltage summation values.

According to the present invention, a battery protection method for protecting N (N≥2) battery cells connected in series includes: a first voltage measurement step of measuring a primary voltage of each of the battery cells through a primary sensing line connected to each battery cell in a monitoring integrated circuit (IC); a second voltage measurement step of controlling a switching circuit connecting between a micro control unit (MCU) and any one of secondary sensing lines connected to the primary sensing lines, and measuring a secondary voltage of each of the battery cells through the respective connected secondary sensing line; a comparison step of comparing a primary voltage of the monitoring IC with a secondary voltage of the MCU and comparing whether a deviation is greater than or equal to a predetermined deviation reference range; and an error determination step of providing a notification alert by determining that an error has occurred in either one of the monitoring IC and the MCU when the comparison result of the comparison step is greater than or equal to a predetermined deviation reference range.

In more detail, the second voltage measurement step includes: a voltage measurement step of sequentially positioning, by the MCU, a switch to a secondary sensing line connected to a negative electrode (−) of the first cell connected to the ground (GND) and the positive electrode (+) of the first cell, respectively, to measure a voltage value of the first cell with a ground (GND) and a positive electrode (+) voltage of the first cell through the switch; and an N-th cell voltage calculation step of sequentially positioning, by the MCU, the switch to a secondary sensing line connected to the negative electrode (−) of the first cell connected to the ground (GND) and the positive electrode (+) of the N-th cell connected to an upper end of the first cell, respectively to calculate a voltage value of the N-th cell using the ground (GND) and the positive electrode (+) voltage of the N-th cell through the switch.

Here, the N-th cell voltage calculation step includes measuring the voltage summation values of the first to N cells with the ground (GND) and the positive electrode (+) voltage of the N-th cell, and calculating the voltage value of the N-th cell by subtracting the voltage summation values of the first to (N−1)-th cells from the measured first to N-th cells voltage summation values.

Advantageous Effects

In the present invention, there is no need to provide a separate secondary protection IC by replacing the function of the secondary protection IC using a switch and an MCU.

Therefore, it is possible to provide a battery protection circuit including a secondary protection IC function that is inexpensive compared to the secondary protection IC and is strong against electromagnetic.

MODE FOR CARRYING OUT THE INVENTION

Figure 1:
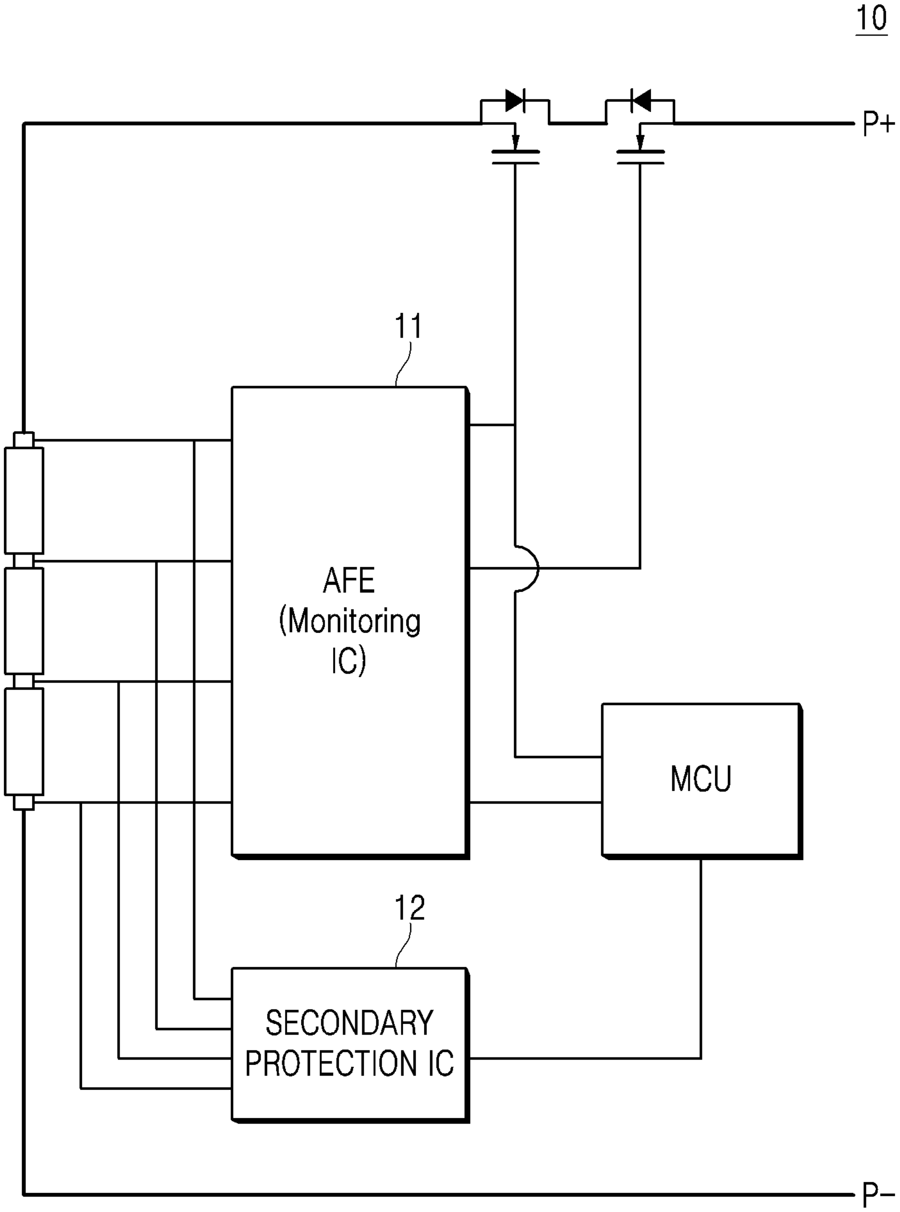
FIG. 1 is a view showing a conventional battery protection circuit.

Hereinafter, embodiments of the present invention will be described in detail with reference to the accompanying drawings so that those of ordinary skill in the art may easily implement the present invention. However, the present invention may be implemented in various forms and is not limited to the embodiments described herein. In the drawings, parts irrelevant to the description are omitted in order to clearly describe the present invention, and like reference numerals refer to like elements throughout the specification.

Hereinafter, the present invention will be described in detail with reference to the drawings.

1. Battery Protection Circuit According to Present Invention

Figure 2:
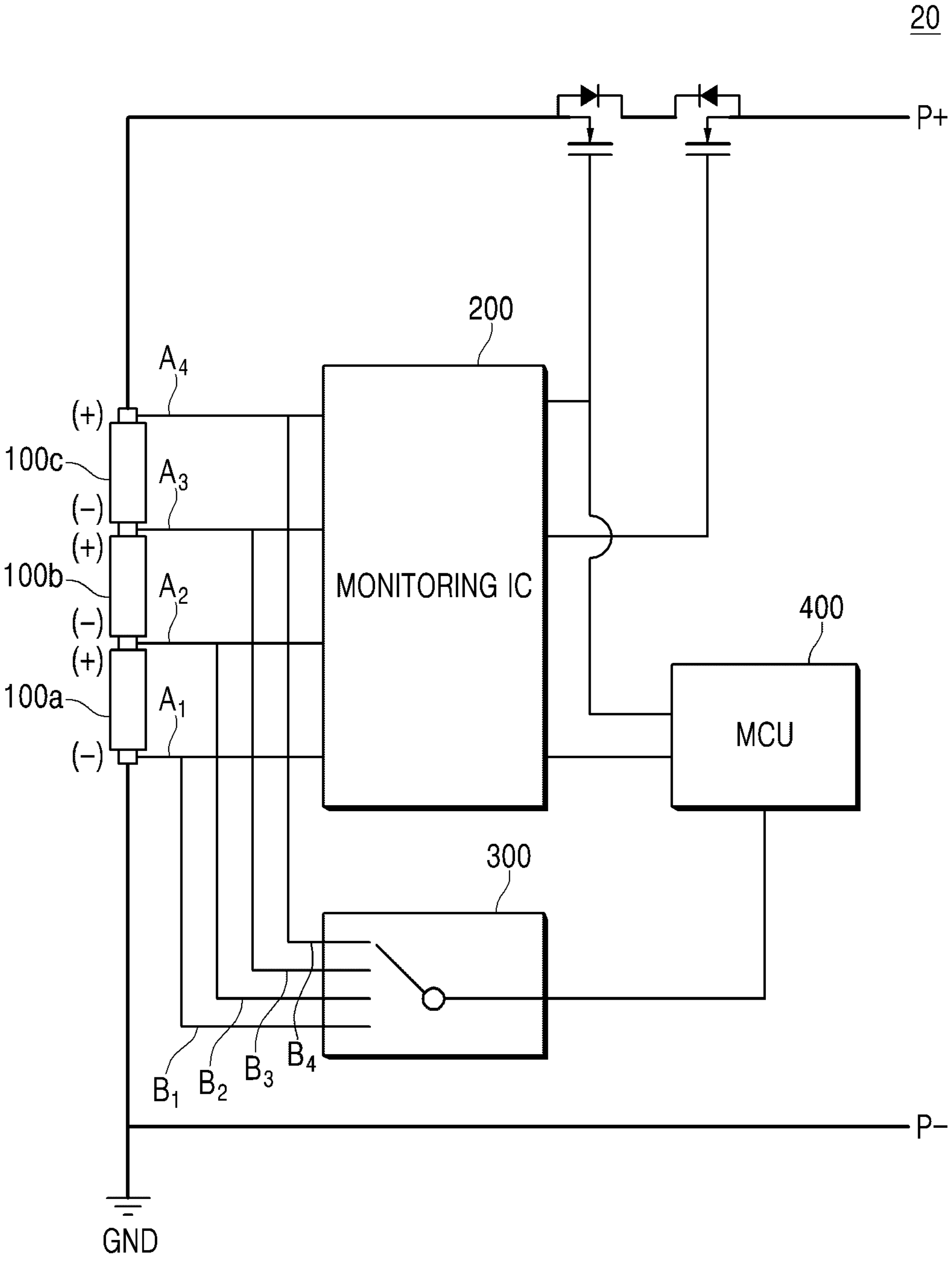
FIG. 2 is a diagram illustrating a battery protection circuit according to the present invention.
Figure 3:
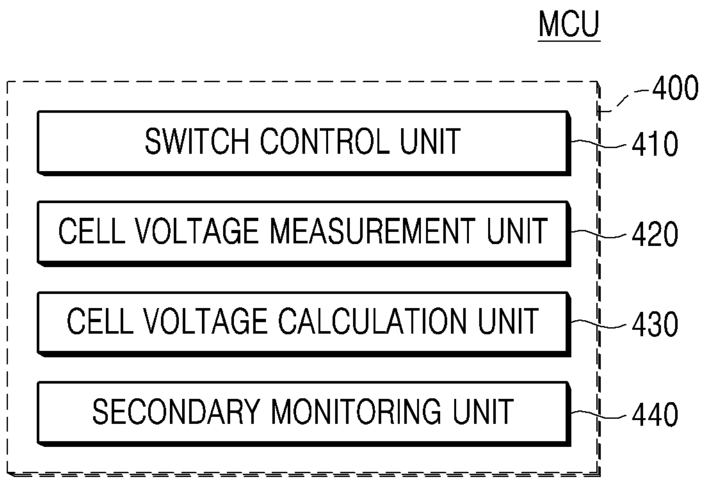
FIG. 3 is a diagram illustrating a detailed configuration of an MCU according to the present invention.

FIG. 2 is a diagram illustrating a battery protection circuit according to the present invention. A battery protection circuit according to the present invention will be described with reference to FIG. 2.

In the present specification, a case in which three battery cells are connected in series as shown in FIG. 2 will be described, but the present disclosure is not limited thereto, and it is possible if two or more battery cells are connected in series.

1.1. Series Connected Battery Cells 100

The battery protection circuit of the present invention is connected to N (N≥2) battery cells connected in series.

If N (N≥2) battery cells are connected in series, among all battery cells, the first cell 100*a*, the second cell 100*b*, . . . , may be referred to as an N-th cell (not shown) from the lowest connected battery cell to the top.

At this time, as shown in FIG. 2, the negative electrode (−) of the first cell 100*a* connected to the lowermost end among the battery cells connected in series is connected to the ground (GND).

1.2. Multiple Primary Sensing Lines

A plurality of primary sensing lines are connected between the series battery cells 100*a* to 100*c* and the monitoring IC 200 as shown in FIG. 2 to sense voltages of each of the battery cells 100.

Specifically, it is configured including a primary first sensing line $A_1$ having one end connected to the negative electrode (−) of the first cell 100*a* and the other end connected to the monitoring IC 200, a primary second sensing line $A_2$ having one end connected between the positive electrode (+) of the first cell 100*a* and the negative electrode (−) of the second cell 100*b* and the other end connected to the monitoring IC 200, a primary third sensing line $A_3$ having one end connected between the positive electrode (+) of the second cell 100*b* and the negative electrode (−) of the third cell 100*c* and the other end connected to the monitoring IC 200, and a primary fourth sensing line $A_4$ having one end connected to the positive electrode (+) of the third cell 100*c* and the other end connected to the monitoring IC 200.

If N (N≥2) battery cells are connected in series, N+1 primary sensing lines $A_1$ to $A_{N+1}$ are connected.

The voltage state of each of the battery cells 100*a* to 100*c* can be primarily monitored by the monitoring IC 200 to be described later through the plurality of primary sensing lines $A_1$ to $A_4$.

1.3. Monitoring IC 200

The monitoring IC measures and monitors the voltage of each of the battery cells 100*a* to 100*c* connected in series through the plurality of primary sensing lines $A_1$ to $A_4$.

Such a monitoring IC is a known configuration and generally uses an AFE IC or an ASIC.

On the other hand, the monitoring IC is configured to include a communication unit (not shown) interconnected with the MCU 400 to be described later.

1.4. Multiple Secondary Sensing Lines

A plurality of secondary sensing lines are respectively connected to the primary sensing lines $A_1$ to $A_4$ to sense voltages of the battery cells 100*a* to 100*c*. As shown in FIG. 2, one end of each secondary sensing line is connected to each primary sensing line, and the other end is connected to a micro control unit (MCU) 400 through a switch 300 to be described later.

Specifically, it is configured including a secondary first sensing line $B_1$ having one end connected to the primary first sensing line $A_1$ and the other end connected to the MCU 400 through the switch 300, a secondary second sensing line $B_2$ having one end connected to the primary second sensing line $A_2$ and the other end connected to the MCU 400 through the switch 300, a secondary third sensing line $B_3$ having one end connected to the primary third sensing line $A_3$ and the other end connected to the MCU 400 through the switch 300, and a secondary fourth sensing line $B_4$ having one end connected to the primary fourth sensing line $A_4$ and the other end connected to the MCU 400 through the switch 300.

When N battery cells are connected in series, N+1 secondary sensing lines $B_1$ to $B_{N+1}$ are connected to correspond to the primary sensing lines $A_1$ to $A_{N+1}$.

At this time, the secondary sensing line connected to the MCU 400 varies depending on at which the other end of a sensing line among the secondary first to (N+1)-th sensing lines the switch 300 is located.

1.5. Switch 300

The switch is a configuration to connect at least one sensing line among the secondary first to fourth sensing lines $B_1$ to $B_4$ and the MCU 400 under the control of the MCU 400 to be described later as shown in FIG. 2.

Specifically, under the control of the switch control unit 410 of the MCU 400 to be described later, the secondary first sensing line $B_1$ and the secondary second sensing line $B_2$ to the secondary fourth sensing line $B_4$ are alternately connected to the MCU 400.

Through such a switch, the MCU 400 can measure/calculate the voltage of each of the first to third cells 100*a* to 100*c*.

1.6. Micro Control Unit (MCU) 400

The MCU is a configuration to measure the ground (GND) and the positive electrode (+) voltage of each battery cell through the control of the switch 300, and secondary monitor the voltage state of the battery cells based on the voltage values of each of the battery cells calculated using the measured ground (GND) and positive electrode (+) voltages.

In other words, in case that the monitoring IC 200 does not operate normally, the switch 300 and the MCU 400 replace the secondary protection IC function provided in the existing battery protection circuit.

Here, in the voltage measurement method, unlike the conventional secondary protection IC that measures the positive electrode (+) and negative electrode (−) voltages of each battery cell, the MCU 400 of the present invention uses a method of measuring the ground (GND) and the positive electrode (+) voltage of the battery cell using the switch 300.

Meanwhile, the MCU 400 is configured to include a communication unit (not shown) that communicates with the monitoring IC 200 described above.

A. Switch Control Unit 410

The switch control unit controls the switch 300 to be sequentially positioned alternately from the secondary first sensing line $B_1$ and the secondary second sensing line to the fourth sensing lines $B_2$ to $B_4$.

If N battery cells are connected in series, it is to control so that the switch 300 is alternately located on the secondary first sensing line $B_1$ and the secondary second sensing line to the (N+1)-th sensing lines $B_2$ to $B_{N+1}$ sequentially.

More specifically, the switch 300 locates secondary first sensing line $B_1$→secondary second sensing line $B_2$→secondary first sensing line $B_1$→secondary third sensing line $B_3$→secondary first sensing line $B_1$→secondary fourth sensing line $B_4$ in the order to sequentially connect the secondary sensing line and the MCU 400.

The reason for this control is that the voltage value of each battery cell is calculated by measuring the ground (GND) and positive electrode (+) voltages of the battery cells as described above.

B. Cell Voltage Measurement Unit 420

The cell voltage measurement unit measures the sensing voltage of the secondary sensing line connected through the switch 300 under the control of the switch control unit 410.

More specifically, it is connected to secondary first sensing line $B_1$→secondary second sensing line $B_2$→secondary first sensing line $B_1$→secondary third sensing line $B_3$→secondary first sensing line $B_1$→secondary fourth sensing line $B_4$ through the switch 300. Accordingly, in the order of ground (GND)→positive electrode (+) of the first cell 100*a*→ground (GND)→positive electrode (+) of the second cell 100*b*→ground (GND)→positive electrode (+) of the third cell 100*c*, a voltage thereof is measured.

Here, since the battery cells are connected in series, reading the ground (GND) the positive electrode (+) voltage of and the second cell 100*b* may refer to measuring the summed voltage of the first and second cells 100*a* and 100*b*, and reading the ground (GND) and the positive electrode (+)

voltage of the N-th cell 100_n_ may refer to measuring the summed voltage of the first, second, and third cells 100_a_ to 100_c_.

C. Cell Voltage Calculation Unit 430

The cell voltage calculation unit sequentially calculates from the voltage value of the lowermost first cell 100_a_ using the ground (GND) and positive electrode (+) voltages measured by the cell voltage measurement unit 420.

First, the voltage value of the first cell 100_a_ is calculated based on the ground (GND) and the positive electrode (+) voltage of the first cell.

Next, the voltage of the first cell 100_a_ calculated above is subtracted from the sum of the voltages of the first and second cells 100_a_ and 100_b_ measured using the ground (GND) and the positive electrode (+) voltage of the second cell so that the voltage value of the second cell 100_b_ may be calculated.

And, the sum of the voltages of the first and second cells 100_a_ and 100_b_ previously measured is subtracted from the sum of the voltages of the first, second, and third cells 100_a_ to 100_c_ measured using the ground (GND) and the positive electrode (+) voltage of the third cell so that the voltage value of the third cell 100_c_ may be calculated.

With this principle, if N battery cells are connected in series, the sum of the voltages of the first to (N−1)-th cells measured using the ground (GND) and the positive electrode (+) voltage of the (N−1)-th cell is subtracted from the sum of the voltages of the first to N-th cells measured using the ground (GND) and the positive electrode (+) voltage of the N-th cell so that the voltage value of the N-th cell may be calculated.

D. Secondary Monitoring Unit 440

The secondary monitoring unit may compare the voltage values of the respective battery cells calculated by the cell voltage calculation unit 430 with a predetermined reference range to secondary monitor the voltage state of the series-connected cells.

In addition, by comparing the measured voltage of the battery cells received from the monitoring IC 200 through the communication connection with the monitoring IC 200 and the voltage of the battery cells calculated by the cell voltage calculation unit 430 with each other, if the deviation is greater than or equal to the predetermined deviation range, it is determined that an error has occurred in any one of the monitoring IC 200 and the MCU 400 to provide a notification alert.

As described above, the battery protection circuit of the present invention can stably protect the battery from abnormal problems such as overcharging and overdischarging even when the monitoring IC does not operate normally by replacing the function of the secondary protection IC by using the switch 300 and the MCU 400 without having a secondary protection IC.

2. Voltage Measurement Method of Series-Connected Cells Using Battery Protection Circuit According to Present Invention A method of measuring the voltage of series-connected cells using a battery protection circuit according to the present invention is configured to sequentially measure the voltage value of the first cell 100_a_ connected to the lowermost stage among the battery cells using the switch 300 connecting between the voltage sensing line connected to each of the series-connected battery cells and the MCU 400.

2.1. First Cell Voltage Measurement Step

First, the voltage of the first cell 100_a_ connected to the lowermost stage among the battery cells connected in series is measured. The method allows the switch 300 to be sequentially positioned at the secondary first sensing line $B_1$ connected to the negative electrode (−) of the first cell 100_a_ connected to the ground (GND) and the secondary second sensing line $B_2$ connected to the positive electrode (+) of the first cell 100_a_ so that the voltage value of the first cell is measured using the ground (GND) and the positive electrode (+) voltage of the first cell through the switch 300.

2.2. Second Cell Voltage Measurement Step

After measuring the voltage of the first cell 100_a_, which is the lowest cell, the voltage of the second cell 100_b_ connected to the upper end of the first cell 100_a_ is measured. The method allows the switch 300 to be sequentially positioned at the secondary first sensing line $B_1$ connected to the negative electrode (−) of the first cell 100_a_ connected to the ground (GND) and the secondary third sensing line $B_3$ connected to the positive electrode (+) of the second cell 100_b_ so that the sum of the voltages of the first and second cells is measured using the ground (GND) and the positive electrode (+) voltage of and the second cell through the switch 300. Then, by subtracting the voltage value of the first cell 100_a_ previously measured in the first cell voltage measurement step from the measured voltage sum of the first and second cells 100_a_ and 100_b_, the voltage value of the second cell 100_b_ may be calculated.

2.3. Third Cell Voltage Measurement Step

Measuring the voltage of the third cell 100_c_ includes sequentially positioning the switch 300 at the secondary first sensing line $B_1$ connected to the negative electrode (−) of the first cell 100_a_ connected to the ground (GND) and the secondary fourth sensing line $B_4$ connected to the positive electrode (+) of the third cell 100_c_ to measure the sum of voltages of the first, second, and third cells 100_a_, 100_b_, and 100_c_ measured using the ground (GND) and the positive electrode (+) voltage of the third cell through the switch 300. Then, by subtracting the summed voltage values of the first and second cells 100_a_ and 100_b_ previously measured in the second cell voltage measurement step from the measured summation values of the voltages of the first, second, and third cells, the voltage value of the third cell 100_c_ may be calculated.

In this way, when N battery cells are connected in series, measuring the voltage of the N-th cell allows the switch 300 to be sequentially positioned at is connected to the secondary first sensing line $B_1$ connected to the negative electrode (−) of the first cell 100_a_ connected to the ground (GND) and the secondary (N+1)-th sensing line (not shown) connected to the positive electrode (+) of the N-th cell to measure the sum of the voltages of the first to N-th cells using the ground (GND) and the positive electrode (+) voltage of the N-th cell through the switch 300, and calculate the voltage value of the N-th cell by subtracting the previously measured summation values of the voltages of the first to (N−1)-th cells from the voltage summation value.

3. Battery Protection Method Using Battery Protection Circuit According to Present Invention A method of protecting cells connected in series using a battery protection circuit according to the present invention may be configured as follows.

3.1. First Voltage Measurement Step

The monitoring IC 200 measures the primary voltage of each battery cell through primary sensing lines $A_1$ to $A_{N+1}$. Measuring the primary voltage of each battery cell in the monitoring IC 200 uses a method of measuring positive electrode (+) and negative electrode (−) voltages of the battery cells as is commonly known.

3.2. Second Voltage Measurement Step

The MCU 400 controls the switch 300 to measure the voltage of each battery cell secondary. Measuring the secondary voltage of the battery cell in the MCU 400 uses a method of measuring the ground (GND) and the positive electrode (+) voltage of the battery cell. More specifically, the secondary voltage of the battery cells connected in series may be measured through procedures such as the first cell voltage measurement step, the second cell voltage measurement step, and the third cell voltage measurement step described above.

3.3. Error Determination Step

When the primary voltage measurement in the monitoring IC 200 and the secondary voltage measurement in the MCU 400 are completed through the first and second voltage measurement steps, the primary measure voltage of the monitoring IC 200 and the secondary measured voltage of the MCU 400 are compared to each other, and whether the deviation is greater than or equal to a predetermined deviation range is compared. If it is out of the range, it is determined that an error has occurred in any one of the monitoring IC 200 and the MCU 400, and a notification alert indicating this may be provided.

Meanwhile, the above-described second voltage measurement step may be performed when the first voltage measurement step is not normally performed because the monitoring IC 200 does not operate normally. Then, the error determination step may be configured to provide a notification alert indicating that an error has occurred in the monitoring IC 200.

As such, by implementing the secondary protection configuration using the switch 300 and the MCU 400 in case the monitoring IC 200, which is the primary protection configuration, does not operate normally, it is possible to smoothly perform a protection operation to protect the battery from abnormal problems such as overcharging and overdischarging without a separate secondary protection IC.

On the other hand, although the technical idea of the present invention has been specifically described according to the above embodiment, it should be noted that the above embodiments are for the purpose of explanation and not limitation. In addition, those skilled in the art in the technical field of the present invention will be able to understand that various embodiments are possible within the scope of the spirit of the present invention.

DESCRIPTION OF SYMBOLS

100*a*~100*c*: battery cell
200: monitoring IC
300: switch
400: MCU
410: SWITCH CONTROL UNIT
420: CELL VOLTAGE MEASUREMENT UNIT
430: CELL VOLTAGE CALCULATION UNIT
440: SECONDARY MONITORING UNIT

The invention claimed is:

1. A battery protection circuit configured in a battery pack in which at least N battery cells are connected in series, a first cell at the lowest end among the battery cells has a negative pole that is connected to a ground, wherein N≥2, the battery protection circuit comprising:

a plurality of primary sensing lines connected between positive/negative electrodes of each battery cell and a monitoring integrated circuit (IC), the monitoring IC being configured to perform primary monitoring by measuring a voltage of each of the battery cells through the plurality of primary sensing lines;

a plurality of secondary sensing lines, each secondary sensing line of the plurality of secondary sensing lines being connected to a different primary sensing line of the plurality of primary sensing lines; and a switch configured to connect one secondary sensing line among the plurality of secondary sensing lines and a micro control unit (MCU), wherein the MCU is configured to;

measure the ground and a positive electrode voltage of each battery cell with a respective one of the secondary sensing lines that is selectively connected to the MCU through a control of the switch, and perform secondary monitoring by sequentially calculating voltages of the first cell to the N-th cell based on the measured ground and positive electrode voltages of the battery cells.

2. The battery protection circuit of claim 1, wherein the plurality of primary sensing lines comprises:

a first primary sensing line having a first end connected to the negative electrode of the first cell and a second end connected to the monitoring IC;

an N-th primary sensing line having a first end connected between the positive electrode of the (N−1)-th cell and the negative electrode of the N-th cell and a second end connected to the monitoring IC; and an (N+1)-th primary sensing line having a first end connected to the positive electrode of the N-th cell and a second end connected to the monitoring IC.

3. The battery protection circuit of claim 2, wherein the plurality of secondary sensing lines comprises:

a first secondary sensing line having a first end connected to the first primary sensing line and a second end connected to the MCU through the switch to sense the ground;

an N-th secondary sensing line having a first end connected to the N-th primary sensing line and a second end connected to the MCU through the switch to sense the positive electrode voltage of the (N−1)-th cell; and an (N+1)-th secondary sensing line having a first end connected to the (N+1)-th primary sensing line and a second end connected to the MCU through the switch to sense the positive electrode voltage of the N-th cell.

4. The battery protection circuit of claim 3, wherein the MCU comprises:

a switch control unit configured to sequentially locate the switch alternately from the first secondary sensing line and a second secondary sensing line to the (N+1)-th secondary sensing line;

a cell voltage measurement unit configured to measure ground and positive electrode voltages of a corresponding battery cell with a secondary sensing line connected through the switch under the control of the switch control unit;

a cell voltage calculation unit configured to sequentially calculate voltage values from the first cell to the N-th cell using the ground and positive electrode voltages of the battery cells measured by the cell voltage measurement unit; and a secondary monitoring unit configured to perform secondary monitoring of voltage states of the battery cells based on respective voltage values of the first to N-th cells calculated by the cell voltage calculation unit.

5. The battery protection circuit of claim 4, wherein the cell voltage measurement unit:

measures the ground and the positive electrode voltage of the (N−1)-th cell through the first secondary sensing line and the N-th secondary sensing line, and measures the ground and positive electrode voltages of the N-th cell through the first secondary first-sensing line and the (N+1)-th secondary sensing line.

6. The battery protection circuit of claim 5, wherein the cell voltage calculation unit:

calculates a voltage value of the first cell from the positive electrode voltage of the first cell and the ground measured by the cell voltage measurement unit, calculates voltage summation values for each of the first to N-th cells, the voltage summation value of the N-th cell being the total voltage of adjacent cells from the N-th cell to the first cell calculated using the positive electrode voltage of the N-th cell and the ground measured by the cell voltage measurement unit, and calculates the voltage value of the N-th cell by subtracting the voltage summation value of the (N−1)-th cell from the voltage summation value of the N-th cell.

7. A method of measuring a voltage of an N-th cell from a first cell at the lowest end among N battery cells connected in series, wherein N≥2, the method comprising:

using a switch to connect a micro control unit (MCU) to a voltage sensing line of a plurality of voltage sensing lines respectively connected to each of the N battery cells;

measuring a first cell voltage by sequentially positioning the switch to connect the MCU to a voltage sensing line associated with a negative electrode of the first cell connected to a ground and a voltage sensing line associated with a positive electrode of the first cell, respectively, thereby measuring the first cell voltage using the ground and the positive electrode of the first cell through the switch; and measuring an N-th cell voltage by sequentially positioning the switch to connect the MCU to the voltage sensing line associated with the negative electrode of the first cell connected to the ground and a subsequent voltage sensing line associated with the positive electrode of the N-th cell connected to an upper end of the first cell, directly or in series, respectively, thereby measuring the N-th cell voltage using the ground and the positive electrode of the N-th cell through the switch.

8. The method of claim 7, further comprising:

calculating the N-th cell voltage by:

measuring voltage summation values for each of the N cells, the voltage summation value of the N-th cell being the measured voltage of adjacent cells including the first cell to the N-th cell using the ground and the positive electrode of the N-th cell, and subtracting the voltage summation value of the (N−1)-th cell from the voltage summation value of the N-th cell.

9. A battery protection method for protecting N battery cells connected in series, where N≥2, the battery protection method comprising:

measuring a primary voltage of each of the battery cells through primary sensing lines connecting each battery cell to a monitoring integrated circuit (IC);

controlling a switching circuit configured to connect a micro control unit (MCU) to secondary sensing lines one at a time, the secondary sensing lines being connected to the primary sensing lines;

measuring a secondary voltage of each of the battery cells through the respective connected secondary sensing line;

calculating a deviation between the primary voltage of each battery cell and the secondary voltage of each battery cell;

determining an error by comparing whether the deviation is greater than or equal to a predetermined deviation reference range; and providing a notification alert when an error is determined.

10. The battery protection method of claim 9, wherein the measuring the secondary voltage comprises:

measuring the secondary voltage value of a first cell by sequentially positioning, by the MCU, a switch to a secondary sensing line connected to a negative electrode of a first cell connected to a ground and a secondary sensing line connected to a positive electrode of the first cell, respectively, thereby measuring the secondary voltage value of the first cell with the ground and the positive electrode of the first cell through the switch; and measuring an N-th cell secondary voltage value by sequentially positioning, by the MCU, the switch to the secondary sensing line connected to the negative electrode of the first cell connected to the ground and a secondary sensing line connected to the positive electrode of the N-th cell connected, directly or in series, to an upper end of the first cell, respectively, thereby measuring the N-th cell secondary a voltage value using the ground and the positive electrode of the N-th cell through the switch.

11. The battery protection method of claim 10, wherein the measuring the N-th cell secondary voltage value comprises:

measuring secondary voltage summation values of at least the first cell to the N-th cell and the first cell to the (N−1)-th cell by using the ground, the positive electrode of the first cell, and the positive electrode of the N-th cell; and calculating the voltage value of the N-th cell by subtracting the voltage summation value of the first cell to the (N−1)-th cell from the voltage summation value of the first cell to N-th cell.

12. The battery protection method of claim 9, further comprising:

performing a protection operation to protect at least one battery cell of the N battery cells when an error is determined.

13. The battery protection method of claim 12, wherein the protection operation protects the at least one battery cell from at least one of overcharging or overdischarging.

* * * * *